(12) United States Patent
Pollock et al.

(10) Patent No.: US 11,876,477 B2
(45) Date of Patent: Jan. 16, 2024

(54) POSITION OBSERVER FOR ELECTRICAL MACHINES

(71) Applicant: Technelec Ltd, Oakham (GB)

(72) Inventors: Charles Pollock, Oakham (GB); Helen Pollock, Oakham (GB)

(73) Assignee: Technelec Ltd, Oakham (GB)

( * ) Notice: Subject to any disclaimer, the term of this patent is extended or adjusted under 35 U.S.C. 154(b) by 27 days.

(21) Appl. No.: 17/268,586

(22) PCT Filed: Aug. 15, 2019

(86) PCT No.: PCT/GB2019/052297
§ 371 (c)(1),
(2) Date: Feb. 15, 2021

(87) PCT Pub. No.: WO2020/035693
PCT Pub. Date: Feb. 20, 2020

(65) Prior Publication Data
US 2021/0351728 A1 Nov. 11, 2021

(30) Foreign Application Priority Data

Aug. 15, 2018 (GB) ..................... 1813335
Mar. 11, 2019 (GB) ..................... 1903255

(51) Int. Cl.
*H02P 6/18* (2016.01)
*H02P 6/182* (2016.01)
(Continued)

(52) U.S. Cl.
CPC ............ *H02P 6/181* (2013.01); *G01R 15/181* (2013.01); *H02P 6/182* (2013.01); *H02P 21/141* (2013.01);
(Continued)

(58) Field of Classification Search
CPC ........ H02P 6/181; H02P 6/182; H02P 21/141; H02P 21/18; H02P 21/28; H02P 2203/05;
(Continued)

(56) References Cited

U.S. PATENT DOCUMENTS

| 5,525,886 A | 6/1996 | Lyons et al. |
| 2005/0269982 A1 | 12/2005 | Coles et al. |

(Continued)

FOREIGN PATENT DOCUMENTS

| CN | 108183648 A | 6/2018 |
| EP | 2665176 A1 | 11/2013 |

(Continued)

OTHER PUBLICATIONS

Holtz J et al. "Sensorless aquisition of the rotor position for induction motors with arbitrary stator windings", Industry Applications conference, 2004. 39th IAS Annual Meeting. Conference Record of the 2004 IEEE Seattle, WA, USA Oct. 3-7, 2004, Piscataway, NJ, USA, IEEE, vol. 2, Oct. 3, 2004 (Oct. 3, 2004).*
(Continued)

*Primary Examiner* — Muhammad S Islam
*Assistant Examiner* — Bradley R Brown (57) ABSTRACT

A control system for an electrical motor comprises a rotor, a stator having a plurality of phase windings, and an inverter for applying voltage to the plurality of phase windings by connecting individual phase windings to a first or second voltage level. The control system is configured to measure a first rate of change of current in a first phase winding, of said plurality of phase windings, connected to the first voltage level, to measure a second rate of change of current in a second, different phase winding connected to the first voltage level, and to calculate a difference between the first and second rate of change of current. The control system is
(Continued)

further configured to use the calculated difference to obtain data related to a position of the rotor.

16 Claims, 8 Drawing Sheets

(51) Int. Cl.
   *H02P 21/14* (2016.01)
   *H02P 21/18* (2016.01)
   *H02P 21/28* (2016.01)
   *G01R 15/18* (2006.01)

(52) U.S. Cl.
   CPC .............. *H02P 21/18* (2016.02); *H02P 21/28* (2016.02); *H02P 2203/05* (2013.01)

(58) Field of Classification Search
   CPC ................ H02P 6/185; H02P 21/0021; H02P 21/0025; H02P 21/24; H02P 6/18; H02P 6/188; H02P 25/026; G01R 15/181
   See application file for complete search history.

(56) References Cited

U.S. PATENT DOCUMENTS

| | | | |
|---|---|---|---|
| 2009/0218973 | A1 | 9/2009 | Pollock et al. |
| 2010/0301789 | A1 | 12/2010 | Pollock et al. |
| 2015/0381090 | A1 | 12/2015 | Henderson et al. |

FOREIGN PATENT DOCUMENTS

| | | |
|---|---|---|
| GB | 2501370 A | 10/2013 |
| JP | H07177788 | 7/1995 |
| JP | 2011176975 | 9/2011 |

OTHER PUBLICATIONS

Rezaee Morteza et al. "Real-time measurement of d- and q-axis currents Rogowski coil", 2015 North American Power Symposium (NAPS), IEEE, Oct. 4, 2015 (Oct. 4, 2015), pp. 1-5, XP032816393, DOI: 10.1109/NAPS.20115.7335257.*

International Preliminary Report on Patentability for PCT Application No. PCT/GB2019/052297, dated Feb. 16. 2021, 16 pages.

International Search Report and Written Opinion for Application No. PCT/GB2019/052297, dated Dec. 10, 2019, 25 pages.

Holtz et al., "Sensorless aquisition of the rotor position angle for induction motors with arbitrary stator windings", IEEE Transactions on Industry Applications, Nov./Dec. 2005, vol. 41, No. 6, pp. 1675-1682.

Rezaee et al., "Real-time measurement of d- and q-axis currents using Rogowski coil", 2015 North American Power Symposium (NAPS), IEEE, Oct. 4, 2015, pp. 1-5.

Deshpande et al., "Standstill position estimation of SPMSM", IECON 2012, 38th Annual Conference on IEEE Industrial Electronics Society, Oct. 25, 2012, pp. 2024-2029.

Ranta et al., "Online identification of parameters defining the saturation characteristics of induction machines", Electrical machines (ICEM), 2012 XXth International Conference on IEEE, Sep. 2, 2012, pp. 1027-1033.

Xu et al., "High-Frequency Injection-Based Stator Flux Linkage and Torque Estimation for DB-DTFC Implementation on IPMSMs Considering Cross-Saturation Effects", IEEE Transactions on Industry Applications, Nov./Dec. 2014, vol. 50, No. 6, pp. 3805-3815.

Morimoto et al., "Sensorless Control Strategy for Salient-Pole PMSM Based on Extended EMF in Rotating Reference Frame", IEEE Transactions on Industry Applications, Jul./Aug. 2002, vol. 38, No. 4, pp. 1054-1061.

Search and Examination Report for GB Application No. 1911727.4 dated Feb. 13, 2020, 6 pages.

Search Report for GB Application No. 1813335.5 dated Sep. 6, 2019, 2 pages.

Search Report for GB Application 1813335.5 dated Jan. 31, 2019, 4 pages.

* cited by examiner

POSITION OBSERVER FOR ELECTRICAL MACHINES

This application is a national phase application of International Patent Application No. PCT/GB2019/052297, filed on Aug. 15, 2019, which is based on and claims the priority to and benefits of British application No. GB 1813335.5 filed on Aug. 15, 2018, and British application No. GB 1903255.6 filed on Mar. 11, 2019. The content of all of the above applications is incorporated herein by reference in their entirety.

This invention relates to the control of electrical machines without mechanical sensors and more specifically to the combined use of two different sensorless control schemes whereby data collected while running in one scheme is used to adapt the model of the motor used when the motor runs with other scheme.

Brushless electronically commutated synchronous motors include permanent magnet brushless dc and brushless ac, synchronous reluctance, flux switching and switched reluctance motors.

An electronically commutated synchronous motor relies on knowledge of the position of the rotor to correctly excite particular phase windings in the motor to deliver torque of the required magnitude and direction. Methods to detect rotor position without the use of shaft position sensors have been the subject of much research. The prior art methods divide into two categories:
  a) Methods which use the back emf induced in the stator windings created by rotation of permanent magnet fluxes or by variation in phase winding inductances while current flows in the winding;
  b) Methods which detect position dependent changes in the inductance of the stator windings.

Methods (a) rely on the speed of rotation of the motor to be fast enough such that the induced emf or back emf is large enough to detect accurately. The back emf can be measured directly if there are times when current is not flowing in a phase winding. Alternatively the back emf is estimated by real time calculations involving the solution of the voltage equation of the phase windings. For accurate estimation of the emf it is important to have a good model for the phase resistance and the phase inductance. The model used for the back emf estimation is completely dependent on the type of motor: a permanent magnet motor with magnets mounted on the surface of the rotor has a magnet induced emf and negligible emf due to inductive variation; a synchronous reluctance motor with no magnets on the rotor has an induced emf due to inductive variation only; an Internal Permanent Magnet motor or permanent magnet assisted synchronous reluctance motor with magnets mounted internally within the rotor has a mixture of magnet paths and steel paths within the rotor and has a magnet induced emf and an emf due to inductive variation. The concept of extended emf has been developed to combine the emf contributions from the different sources into a single term. Providing the model used for the estimation of the emf correctly compensates for speed, magnetic saturation, changes in resistance with temperature and eddy current effects then emf and extended emf estimation methods can be very robust but only when the speed is large enough to create the emf. Typically the speed has to be at least 10% of the rated speed to obtain reliable data.

EMF estimation methods (a) cannot be used at low speed or at standstill.

Methods (b) rely on a strong positional variation in self inductance or mutual inductance. In interior permanent magnet motors and synchronous reluctance motors there is a significant difference between the inductance, Ld, on the direct axis of the rotor and inductance Lq, on the quadrature axes of the rotor. In motors with surface mounted magnets on the rotor there is less saliency and the direct and quadrature axis inductances Ld and Lq, are similar. Even when there is limited variation in the direct and quadrature inductances there is usually a detectable change in inductance caused by the saturation effect created in the steel by the flux of the permanent magnet.

The inductance methods (b) provide very clear position data at low speed and even at standstill. However, the practical implementation is difficult. To measure the inductance it is necessary to apply a static voltage vector at a known stator orientation and measure the rate of change of current. This can involve making two current samples a finite time interval apart and then implementing numerical differentiation. Alternatively a Rogowski coil can be used: a Rogowski coil inherently performs magnetic differentiation of the current in a conductor linking the coil. A single sample of the voltage across the Rogowski coil provides measurement of the rate of change of current linking the coil. This is a major advantage as it shortens the time required to measure the rate of change of current and therefore shortens the time when the inverter has to be held in a fixed voltage vector condition. The rate of change of current in each phase winding is also altered by the induced back-emf in that phase winding. It is necessary to take two readings of the rate of change of current in two different inverter voltage states such that the difference in rate of change of current caused by a specific change of state of applied voltage is isolated and the effects of other factors such as back emf and resistive voltage drop are eliminated. As a consequence of the requirement to take two readings of rate of change of current before and after a change in state of the inverter switches to isolate the difference in the rate of change of current caused by a specific voltage transition, errors will occur in this measurement method as the motor speed increases. Firstly as the back emf increases in magnitude with increasing speed, the difference in the rate of change of current caused by inverter switching transitions becomes a smaller signal within the overall dynamics of the motor phase current waveform. Secondly the distance travelled by the rotor between the two rate of change of current measurements increases with rotational speed such that the measurement are no longer at the same rotor angle. When they are subtracted to isolate the position dependent change in rate of change of current, an additional error is introduced by the angle turned by the rotor between the two readings.

The methods (b) deliver data of the variation in inductance with position. The dominant variation in inductance with position occurs twice per electrical cycle of the motor. There are two cycles of inductance variation for one cycle of current. That is because there is a direct axis in line with a north pole and a second direct axis in line with a south pole. Whilst there is a small difference in the inductance of the motor phase winding caused by the polarity of the magnet it is very difficult to detect without a significant injection of current distortion to the torque producing waveform. This causes additional acoustic noise and should be avoided. Another consideration with the implementation of methods (b) is that the inductance of the motor phase windings changes with the current in the phase winding due to magnetic saturation. The measurements obtained from rate of change of current do not therefore deliver values of inductance which uniquely map to positions without additional non-linear data processing incorporating an accurate non-linear model of the motor magnetic structure.

The errors arising from Method (b) are therefore significant as the motor speed and load increases.

It is the purpose of this invention to disclose a technique of driving a synchronous motor from low speed to high speed using a combination of inductance detection at low speed and emf estimation at high speed whereby the inductance detection method at lower motor speeds or at standstill includes the step of calculating or updating one or more of the motor parameters required for sensorless position estimation from emf estimation at higher motor speeds.

The invention may also involve the use of fitting techniques to interpolate the data points of the motor parameters.

Calculation of the motor parameter may be implemented only during a motor commissioning phase or may be implemented whenever the motor is operating in a low speed regime.

Both methods, using inductance detection and emf estimation, may be run in parallel with the controller apportioning weighting to the control signal to be used depending on motor speed.

Aspects of the invention are set out in the independent claims.

In order that the invention may be more fully understood reference will now be made, by way of example, to the accompanying drawings, in which.

Figure 1:
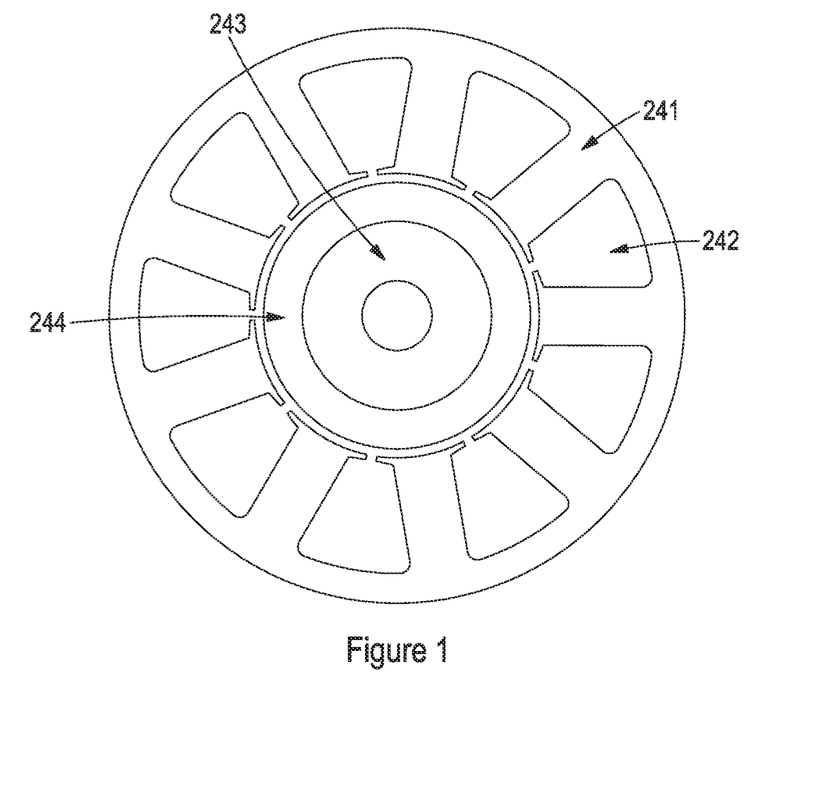
FIGS. 1, 2, 3 and 4 are sections through examples of machines to which the controller of the invention may be applied.

FIG. 1 shows a permanent magnet synchronous motor with magnets mounted on the surface of the rotor. The stator 241 is made from laminated steel. In this example the stator has 9 teeth interspersed between the 9 slots 242. The stator winding would typically be wound with a short pitch with one coil wound around each tooth and then the three coils spaced at 120° to each other connected together to create each of three phase windings. The rotor has a steel core 243 surrounded by a layer of permanent magnet material, 244. In this example the permanent magnet layer 244 is magnetized radially to create a six pole magnetic field. Rotation of the rotor induces three emfs in the stator windings which are displaced in phase by 120° (electrical degrees). Operation as a motor requires an inverter to deliver three alternating armature currents in synchronism with the internal emf induced in each winding. The inductance of the phase windings of this motor does not change significantly with rotor position.

Figure 2:
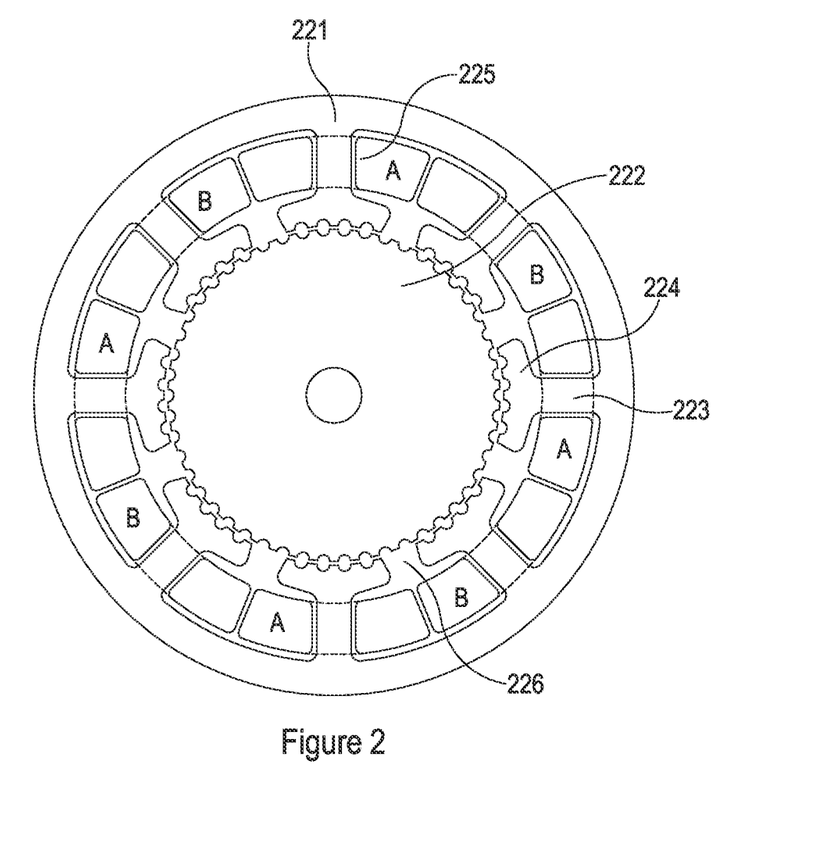

The hybrid stepping motor is a further example of a synchronous motor. Hybrid stepping motors usually have two, three or five phase windings. FIG. 2 illustrates a transverse cross-section through one end of a typical two-phase hybrid stepping motor.

The two-phase hybrid stepping motor of FIG. 2 consists of a stator 221 and a rotor 222, both of which are constructed from stacked laminations of electrical grade steel. The stator has eight poles 223, four associated with each phase, which widen at the tips to a group of teeth 224. Each stator pole 223 has a winding in the form of a short-pitched phase coil 225. These coils 225 are connected, usually in series, to form two electrically independent motor phase windings A and B. The rotor has a large number of radially spaced teeth 226 (typically 50) at each of its ends, and incorporates a permanent magnet which produces static flux along the axis of the machine. This makes the rotor teeth at one end of the machine all North poles and the rotor teeth at the other end of the rotor all South poles. The teeth 226 at one end of the rotor 222 are offset by half a tooth pitch with respect to the teeth 226 at the other end of the rotor 222. The rotor tooth pitch is the same as the tooth pitch of the stator 221. The emf induced in the two stator phase windings arises from the rotation of the rotor. The emf in phase A is 90° phase shifted from the emf in phase B. The inductance variation in the stator phase windings is relatively small because two of the 4 stator poles have the opposite alignment compared to the other two stator poles. Sensorless operation of the hybrid stepping motor is improved significantly by the use of this invention. The weak inductance signal means that sensorless operation with back emf estimation methods has to cover a greater range of operating speeds and an accurate non-linear motor model is vital to allow the hybrid stepping motor to operate down to speeds as low as 1 rps (60 rpm).

Figure 3:
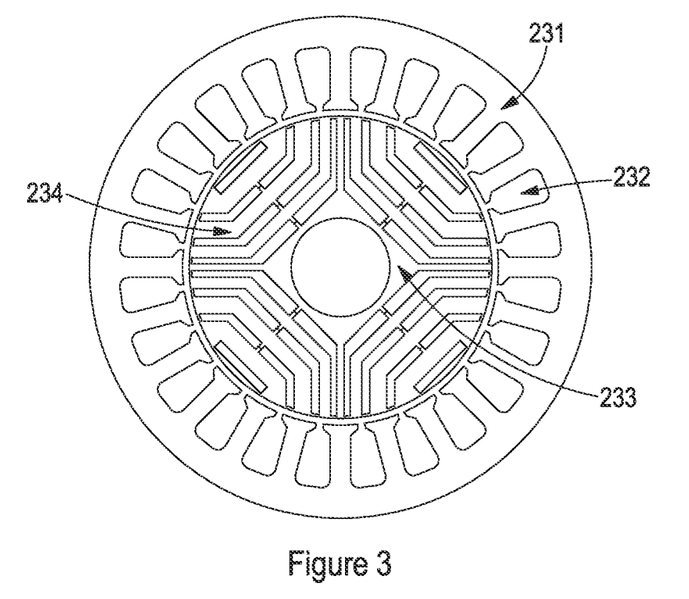

FIG. 3 shows a synchronous reluctance motor with stator 231 and rotor 233. The stator shown has 24 slots 232, though 12 and 36 stator slots are also common. The stator slots contain a distributed three phase winding. The rotor 233 is made from laminated steel and contains slotting to act as flux barriers. This creates axes of high and low reluctance such that if the stator winding creates a 4 pole magnetic field the rotor will align the flux barriers so that the stator flux follows a low reluctance path. As the stator field rotates the rotor will follow the field in synchronism. Many different rotor constructions can be used, the aim being to deliver the maximum ratio of reluctance variation. In this motor there is no rotating magnet to induce an emf in the stator windings; the torque is created by variations in the self inductances of the stator windings and variations in the mutual inductance between phase windings as the rotor rotates.

As an enhancement to the synchronous reluctance motor, permanent magnets can be inserted within the rotor slotting to increase the magnetic saliency further and increase torque production. Such a machine is known as a permanent magnet assisted synchronous reluctance motor. In a permanent magnet synchronous reluctance motor torque is produced by the stator current interacting with both magnet induced emf and emf induced from variable inductance.

Figure 4:
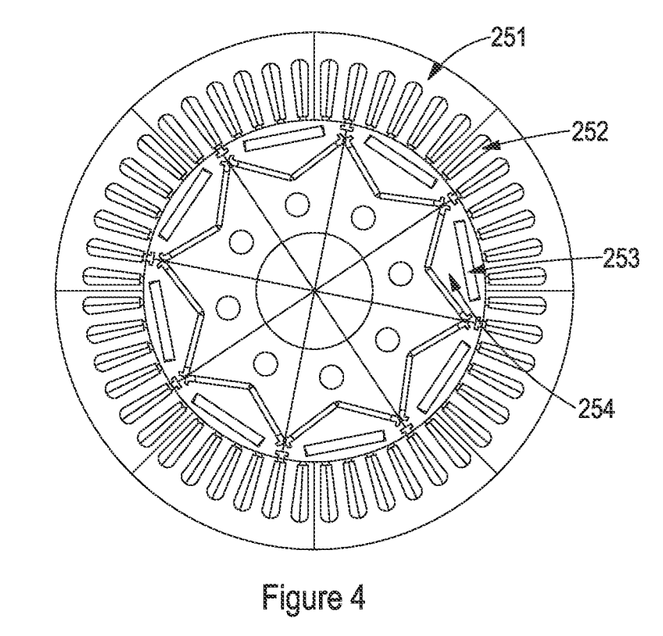

FIG. 4 shows a permanent magnet motor in which the permanent magnets 253 are located within the steel lamination of the rotor. This form of rotor is referred to as interior permanent magnet (IPM) and provides permanent magnet flux linking the stator phase windings while the steel sections between the magnets 254 provide a path of variable inductance for the stator flux. Typically the inductance Ld of the direct axis in line with the magnet axis is lower than the quadrature inductance Lq in line with the axis between the magnets where there is a greater content of steel. The stator slots 252 in the stator 251 would typically contain a distributed three phase winding though it is also possible to have an interior permanent magnet motor with a stator with fewer slots and a concentrated coil winding.

All of these machine types have the common feature that they can be modelled as having an internally induced, rotational emf in the stator windings. The rotational emf will include components induced from the rotation of magnets in motors containing permanent magnets (FIG. 1, FIG. 2 and FIG. 4) and will contain additional emf components if there is a variation between the direct axis inductance Ld and the quadrature axis inductance Lq as the rotor rotates. In synchronous reluctance motors the variation in reluctance as the rotor rotates leads to variations in both the self inductance of each phase winding and variations in mutual inductance between windings. The term "rotational emf" as used in this invention, can therefore be any time varying combination of changing fluxes, due to a phase winding's own current (self inductance), the currents in other windings (mutual inductance) or a rotating permanent magnet. In certain interior permanent magnet motors the rotational emf will comprise components from variations in both permanent magnet flux and inductance as the rotor rotates.

In the mathematical analysis of electrical machines of these types it is common to analyze the machine totally in electrical cycles and electrical degrees. When this is done the analysis is similar for all synchronous machines of any type and pole numbers. In such analysis it is common to transform the statically orientated, time varying quantities of each stator phase winding into a single system of rotating vectors, rotating at the same frequency as the electrical frequency of the rotor.

Figure 5:
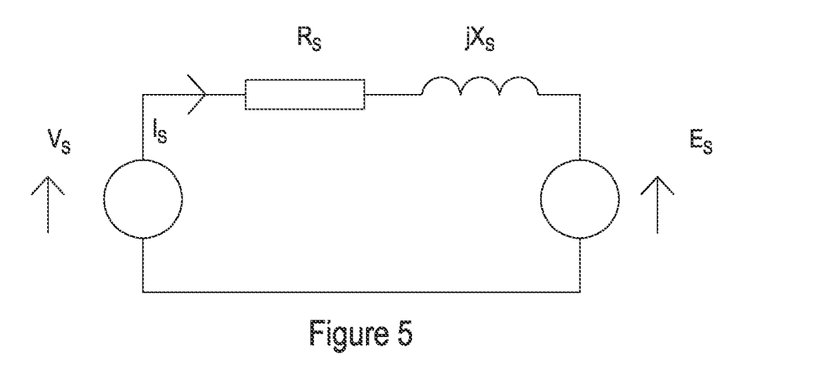
FIG. 5 shows an equivalent circuit of a machine according to the invention in the rotating reference frame.

Using the electrical quantities on a synchronously rotating reference frame containing components of all the phase windings of the motor an equivalent circuit is shown in FIG. 5. The stator voltage equation, in any synchronous rotating reference frame, is given by:

$$\overline{V_s} = \overline{E_s} + j\overline{I_s}X_s + \overline{I_s}R_s, \quad (1)$$

where $\overline{V_s}, \overline{E_s}, \overline{I_s}$ are the vector quantities of the stator voltage, rotational emf and stator current with respect to the rotating reference frame; Xs is the reactance of the stator phase winding and Rs is the resistance of the stator phase windings. If there is a difference between the direct axis inductance Ld and the quadrature axis inductance Lq, Xs will be a complex vector with different in-phase and out-of-phase components. This is common in motors with significant variation in reluctance (and hence stator inductance) at different rotor orientations. An example of such a motor where reactance Xs could have different quadrature components would be an interior permanent magnet synchronous motor or a synchronous reluctance motor. However, since the rotating reference frame rotates with the rotor, the components of Xs do not vary significantly with time and the term $j\overline{I_s}X_s$ does not contribute to torque production. The rotational emf is the extended emf containing all emf terms contributing to motor torque production.

The torque produced by the motor is given by $$T = \frac{\overline{I_s} * \overline{E_s} \cos(\gamma)}{\omega}, \quad (2)$$

where

γ is the angle between the rotational emf vector and the stator current;

ω is the rotational velocity of the rotor in mechanical radians per second.

Operation of the motor with maximum torque per ampere is achieved if γ=0 and the $\overline{E_s}$ and $\overline{I_s}$ vectors are coincident. When, γ=0, the rotational emf vector $\overline{E_s}$ is in phase with the stator current vector and the torque is again given by equation (2) which is now maximum and equal to $$T = \frac{\overline{I_s} * \overline{E_s}}{\omega}. \quad (3)$$

Figure 6:
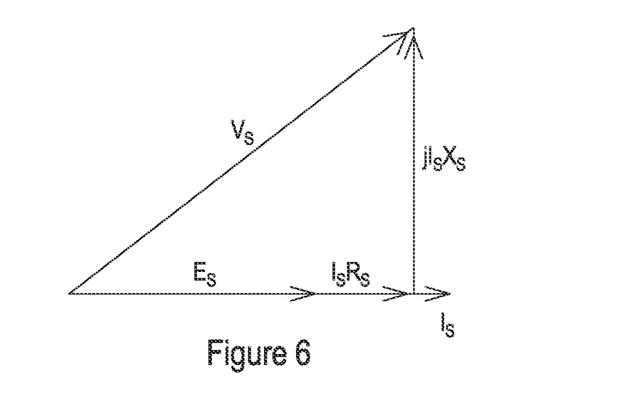
FIG. 6 shows a vector diagram of a motor running with emf in phase with current.

The angular position of the rotational emf vector with respect to the stator current vector therefore determines the torque production of the motor. FIG. 6 shows a vector diagram showing the relationship between stator voltage vectors calculated on the rotating reference frame.

In the example illustrated by FIG. 6, the $\overline{E_s}$ and $\overline{I_s}$ vectors are coincident; γ=0, the rotational emf vector $\overline{E_s}$ is in phase with the stator current vector and the torque is maximum for the given excitation current level and is given by equation (3).

Figure 7:
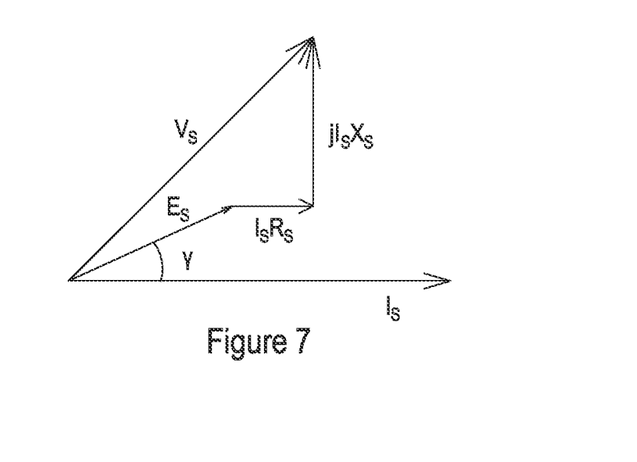
FIG. 7 shows a vector diagram of a motor running in an overexcited way with current lagging the emf vector.

In a further example illustrated by FIG. 7 the rotational emf vector, $\overline{E_s}$ leads the $\overline{I_s}$ vector by an angle γ. The motor is therefore producing less than maximum torque per ampere and the torque is now given by equation (2).

The primary purpose of a sensorless position estimation algorithm is to estimate the position of the rotor in real time while the rotor is rotating and while the load is changing. The secondary purpose is to adjust the operation of the motor to ensure that the torque production mechanism of the motor is optimized to its highest efficiency or to any other criteria determined by a particular application.

Since $\overline{V_s}, \overline{E_s}, \overline{I_s}$ all have real and imaginary parts calculated on a rotating reference frame, the reference frame can be chosen on any particular axis appropriate for the mathematical analysis. In most prior art analysis the d-axis is chosen as the rotating reference frame. However, in a motor with emf components induced from both inductive and magnet fluxes it is convenient to use the axis of the sum of all rotational emf components as the estimated rotational emf vector position. Equation (1) can be rewritten into a real part (in phase with the estimated rotational emf vector) and an imaginary part (orthogonal to the estimated rotational emf vector):

$$V_{s\_real} = E_{s\_real} + I_{s\_real} * R_s - I_{s\_imag} * X_s \quad (4)$$

and, $$V_{s\_imag} = E_{s\_imag} + I_{s\_imag} * R_s + I_{s\_real} * X_s \quad (5).$$

As described earlier the values of Xs in equations (4) and (5) may be a function of current and may also have components in both the real and imaginary complex planes.

These equations can be rearranged to give equations for the real and imaginary components of the rotational emf vector, $\overline{E_s}$, $$E_{s\_real} = V_{s\_real} - I_{s\_real} * R_s + I_{s\_imag} * X_s \quad (6)$$

$$E_{s\_imag} = V_{s\_imag} - I_{s\_imag} * R_s - I_{s\_real} * X_s \quad (7)$$

If values for Rs and Xs can be determined including any non-linear variation in Xs with current and knowing the magnitude of the voltage vector delivered through the inverter, these equations can be evaluated in real time during rotation of the motor. The magnitude of the voltage vector can either be estimated from the commanded pulse width modulation duty cycles in the inverter or be monitored at the outputs of the inverter. The calculated values from equations (6) and (7) can be used to update the estimate of the rotating reference frame of the rotational emf vector such that the value of Es_imag calculated by equation (7) is kept close to zero.

The above equations are similar to those disclosed in Prior Art documents such as WO 2010055168. Furthermore, documents such as "Sensorless Control of Interior Permanent Magnet Synchronous Motor by Estimation of an Extended Electromotive Force" (Chen et al., IEEE, 2002) and "Sensorless Control Strategy for Salient-Pole PMSM Based on Extended EMF in Rotating Reference Frame) (Morimoto et al., IEEE Transactions on industry applications, vol. 38, No. 4, 2002) describe the combination of all the torque producing emf terms, (whether the emf comes from reluctance variations (inductance variations) or from permanent magnet flux variation) as an extended emf, Ex. Using the terminology in equation (6) and (7), the extended emf, Ex, can be written as:

$$E_x = E_{s\_real} + j E_{s\_imag}. \quad (8)$$

In WO 2010055168 a method was described to use these equations and particularly equation (7) to adjust the operating point of a motor until Es_imag is converging on zero. At that point the torque producing or extended emf has no imaginary component and the rotating reference frame has been determined to track the position of the rotating emf.

However implementation of a sensorless control scheme as described in WO 2010055168 relies on a non-linear model of the inductance of the motor in each axis being determined and implemented over the whole operating range of a motor and generator to correctly determine the reactance term Xs. The reactance Xs will vary independently in the real and imaginary axes with non-linear functions of the current in those axes. There will also be cross-coupling effects since current in one axis will cause saturation in certain parts of the magnetic circuit which are shared by the other axes. In the paper "Sensorless Control of Interior Permanent Magnet Synchronous Motor by Estimation of an Extended Electromotive Force" (Chen et al., IEEE, 2002) and "Sensorless Control Strategy for Salient-Pole PMSM Based on Extended EMF in Rotating Reference Frame) (Morimoto et al., IEEE Transactions on industry applications, vol. 38, No. 4, 2002) the authors ignore the non-linear dependence of the inductance terms with current and refer to constant values for Ld and Lq.

It is possible to make approximations for the model of the reactance Xs and its components arising from Ld and Lq, or to model it off-line using computational calculations of the electromagnetic circuit. The following discussion illustrates the provision of a simple method to create this non-linear relationship within the motor controller even while the motor is rotating or when it is stationary.

In one embodiment, the calculation works as follows. Firstly at zero speed the resistance of the motor phases can be determined by applying an inverter voltage and measuring the dc current which flows. If this dc current vector is orientated in line with an axis of zero torque the rotor will be held in a stationary position during this measurement. If the voltage vector and the current measurements are mapped onto the rotating reference frame (with zero speed) the resulting DC equation can be solved to find resistance. Under dc conditions with no rotation of the vector the reactance terms are zero and the rotational emf terms are zero. It is advantageous to perform the resistance measurement over the whole range of inverter output current as non-linear voltage drops, such as the on-state voltage drops, in the inverter switches can be included in the resistance function as a function of the current flowing. The non-linear resistance function can be stored within memory inside the microprocessor or in an external non-volatile memory circuit.

Secondly at low speed the motor can be operated using inductance sensing methods (b) as described, for example, in publications such as "Sensorless Control of AC Machines at Low Speed and Standstill Based on the "INFORM" Method" (Schroedl, IEEE, 1996) and "Sensorless control of Surface Mounted Permanent Magnetic Machine Using the Standard Space Vector PWM" (Hua et al., IEEE, 2007). In addition, a further calculation may be implemented which provides a significant improvement in the position calculation over the prior art methods. The inverter can be placed in one of six active states referred to as V(1,0,0), V(0,1,0), V(0,0,1), V(0,1,1), V(1,0,1), V(1,1,0), such that only one inverter switching leg is connected to +V (State=1) or only one inverter switching leg is connected to 0V (State=0) while the other two switching legs have the opposite state. Two final non-active or zero vectors states are V(0,0,0) and V(1,1,1). These non-active states apply zero voltage across the motor windings. In each of the six active states there is always one inverter leg which has a unique state and two inverter legs which share a common state.

Figure 8A:
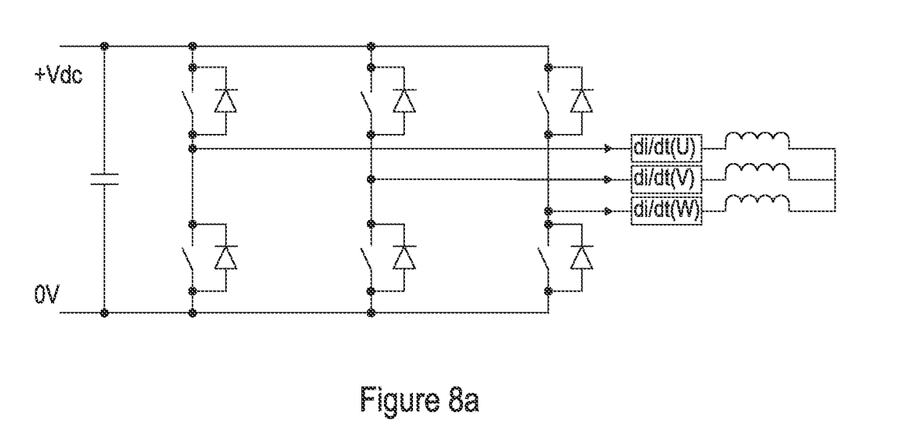
FIG. 8a shows a schematic diagram of an inverter with a three phase motor.

Prior art controllers measure the rate of change of current in the phase winding with the unique state. It has been discovered that additional information is available by using the rate of change of current data from the two phase windings which share a common state. This is illustrated in FIG. 8a, which shows an inverter with a three phase motor (i.e. an electrical motor having three phase windings). The inverter comprises a positive supply rail (+Vdc), a return path (0V) and six diodes connected in parallel with switches. Three inductors, representing the three phase windings, are connected to the inverter. A di/dt sensor (for example a Rogowski coil) is closely coupled to a conductor carrying a current of each phase winding to measure the rate of change of current (di/dt) in that phase winding.

Figure 8B:
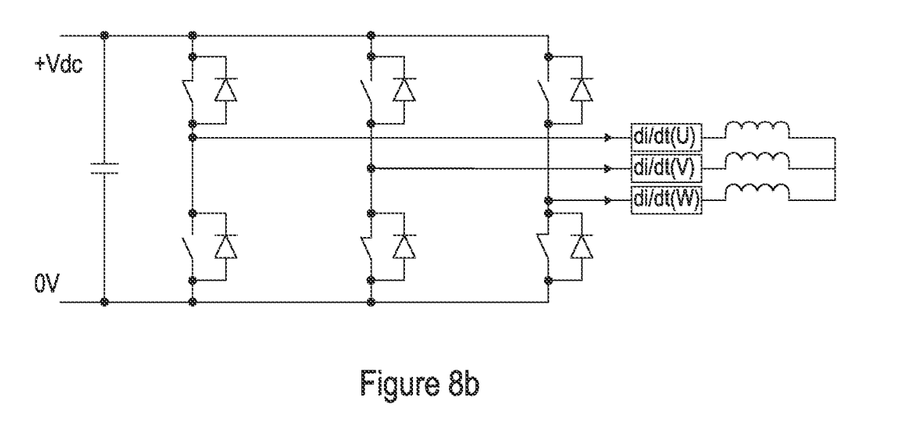
FIG. 8b shows a schematic diagram of the inverter in an inverter state V(1,0,0)

A single measurement in the phase winding with the unique state can be enhanced by additional measurement of the rate of change of current in the other phase windings, as can be understood from FIG. 8b, which shows the inverter in the state V(1,0,0). The switching leg connected to phase U is uniquely in state (1) with the upper switch conducting current from the positive supply rail. The switching legs connected to phases V and W are in the shared state (0) with the lower switches conducting current back to the 0V rail.

In this state, V(1,0,0) the signal for di/dt(U)=−1*(di/dt(V)+di/dt(W))

Therefore di/dt(U)−1*(di/dt(V)+di/dt(W))=2*di/dt(U)

By using all three di/dt measurements and summing the signals in this way the signal of di/dt(U) is doubled and signal to noise ratio is improved. This implementation illustrates that the difference between a first rate of change of current and the sum of second and third rates of change of current can double the resolution of the reading of first rate of change of current.

In a further implementation only two di/dt sensors may be required since the di/dt in the third phase of the inverter can always be calculated knowing that the three phase currents and therefore the three phase di/dt signals add up to zero.

Figure 9:
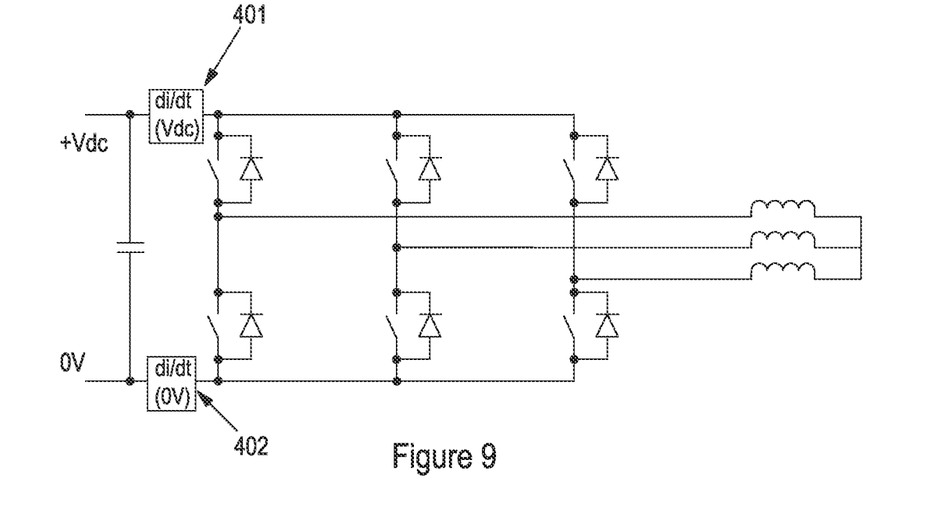
FIG. 9 shows a schematic diagram of another inverter with a three phase motor.

FIG. 9 shows an alternative sensor arrangement for measuring the rate of change of current. Instead of requiring a di/dt sensor in at least two phase outputs of the inverter, it is possible to use a single sensor 401 on the positive dc rail or a single sensor 402 in the 0V rail of the inverter. In each of the active inverter states the di/dt of the current measured by a di/dt sensor in either the +Vdc supply rail or the 0V supply rail will be the same as the current through the phase which has a unique conducting path and will be the sum of the current in the phases sharing the common conducting state.

Figure 10:
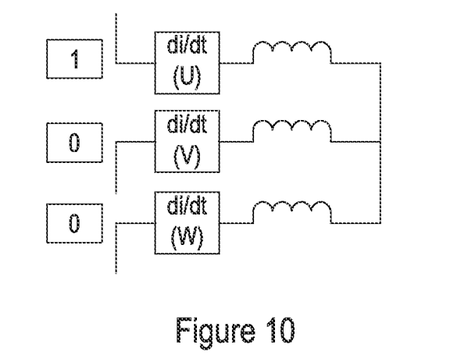
FIG. 10 shows a simplified diagram of the inverter in the V(1,0,0) inverter state.

In the above arrangements, it will be appreciated that at least two temporally spaced measurements will be required to determine any change in di/dt. It has now been discovered that an additional position dependent signal can be measured by subtracting the rate of change of current in the phase windings which have the common switching state (i.e. the phase windings that are connected to the same voltage level). It has been found that measuring the split in the rate of change of current in the two parallel connected common phases provides instantaneous position dependent data without having to use two successive readings in two inverter voltage states. This can be understood with reference to FIG. 10, which shows a simplified diagram of the inverter in state V(1,0,0). In this state the signals di/dt(V) and di/dt(W) will not necessarily be equal. The split in current and the different values of the di/dt between Phase V and Phase W is position dependent and is therefore another measure of the difference in inductance between phases V and W. One of the di/dt signals from the two phases connected to a common supply rail can be subtracted from the other. Using this method some mutual constituent parts of the signals not containing position data, such as amplifier offsets, are automatically cancelled. It is therefore possible to deduce position without needing to wait for an alternative state to isolate the position dependent data. The improvement offered by this approach allows position dependent data to be calculated from an effectively simultaneous set of di/dt measurements, taken close together during a single operating state of the inverter. This approach provides additional position dependent data not accessed by prior art implementations.

The subtraction of the two di/dt signals from phase windings sharing a common state can be implemented in a microprocessor or other control circuit after the two di/dt signals from the phase windings attached to the common state are converted to digital signals in an analog to digital converter.

Alternatively, to avoid some numerical errors and loss in accuracy which can arise in the numerical subtraction of the two digital signals, the subtraction of the rate of change of two phase currents can be achieved in a single Rogowski coil by passing two phase currents through the coil in opposite directions. The subtraction is therefore achieved by cancellation of the magnetic fields and the difference signal is created by the Rogowski coil.

Figure 11:
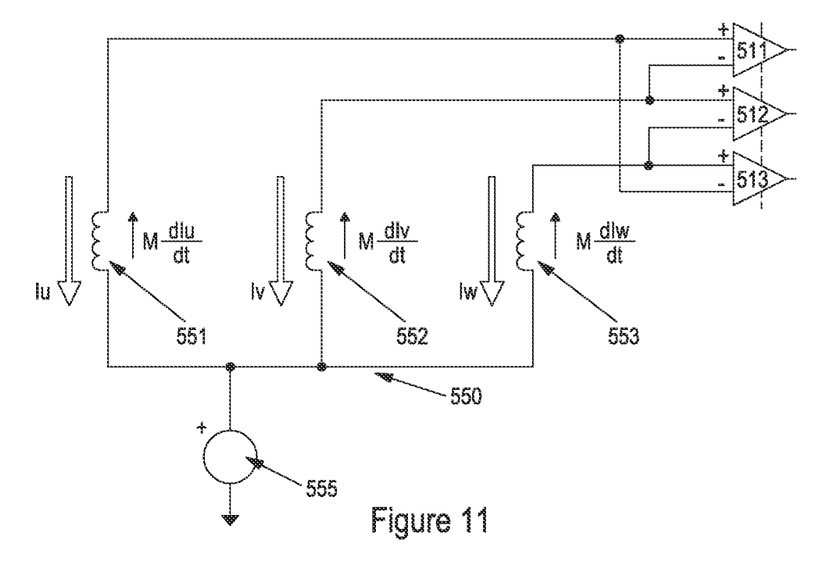
FIG. 11 shows a schematic diagram of three Rogowski coils in a three phase motor.

FIG. 11 shows a further possible connection method for three Rogowski coils, 551, 552 and 553 used to measure the rate of change of currents in a three phase motor. Rogowski coil 551 is placed in close proximity to a conductor carrying the current, Iu, to motor phase U. The voltage induced across the terminals of the Rogowski coil 551 is $$v_{551} = M \frac{dIu}{dt},$$

where M is the mutual inductance between the conductor and the Rogowski coil.

In a similar way Rogowski coils 552 and 553 create voltages v552 and v553 which are proportional to the rate of change of current in conductors carrying the current to motor phases V and W.

As explained above a significant advantage can be obtained by measuring the difference between the rate of change of current in two phases, particularly in any of the inverter states where two phases are connected to the same or common supply rail. FIG. 11 illustrates how this can be achieved with minimum error. One end of each of the Rogowski coils 551, 552, 553 is connected to a central node 550. This central node acts like the star point of a star connected three phase system. In this case it is the star point of the three Rogowski coils measuring the di/dt in the three phase windings. Since the sum of three phase currents adds up to zero, the sum of the differential of three phase currents also adds up to zero. The central node of 551, 552 and 553 will therefore have a relatively stable voltage. For ease of measurement it may also be useful to connect an optional voltage 555 to this central node or star point which shifts all the signals near to the centre of the measurement voltage range.

Using this arrangement, it is now very straightforward to measure the difference between any two rates of change of phase current. An operational amplifier 511 can be arranged to have the signal from Rogowski coil 551 connected to its positive input and the signal from Rogowski coil 552 connected to its negative input. The voltage across the differential input pins of the operational amplifier 511 is therefore $$M \frac{dIu}{dt} - M \frac{dIv}{dt}.$$

The value of M is dependent on the coupling between the conductor carrying the phase current and the Rogowski coil. M also depends on factors such as the number of turns of the Rogowski coil and its cross-sectional area. To obtain consistent measurements it would be expected that the construction and positioning of multiple Rogowski coils in a multiphase motor would be controlled within reasonable manufacturing tolerances. If this is not the case different values of M can be assigned to each measurement to allow variations in M to be included in the calculation.

Using well known methods of feedback the operational amplifier gain, k, will act on the difference between the two signals and create an amplified signal which is directly related to the difference between the rate of change of currents in the two conductors. This amplified signal would be $$kM \left( \frac{dIu}{dt} - \frac{dIv}{dt} \right).$$

This method offers lower noise and distortion than separately amplifying each signal and then making the subtraction after the amplifier. In such a case there can be slight differences in the amplifier gains, k1 and k2 and the output of the subtraction would be $$M \left( k_1 \frac{dIu}{dt} - k_2 \frac{dIv}{dt} \right).$$

Amplifier 512 can be used to measure and amplify the difference between the outputs of Rogowski coils 552 and 553 to give $$kM\left(\frac{dIv}{dt} - \frac{dIw}{dt}\right).$$

Amplifier 513 can be used to measure and amplify the difference between the outputs of Rogowski coils 553 and 551 to give $$kM\left(\frac{dIw}{dt} - \frac{dIu}{dt}\right).$$

In this way the star connection of the three Rogowski coils provides a means to create a signal containing small differences between the rates of change of current in any two motor phase windings and to then amplify that small difference without introducing errors caused by mis-matched gains in two separate amplifiers. In this way the circuit can detect very small differences in the rates of change of currents in two phase windings. Using this approach it has been possible to estimate the position in a permanent magnet synchronous motor with very small variations in inductance with position of the rotor.

The embodiment shown in FIG. 11 has operational amplifiers 511, 512 and 513, but other types of differential amplifiers can be used instead.

The three output signals from amplifiers 511, 512 and 513 can be sampled by a microprocessor and converted to digital data signals. The sampling should coincide with inverter states when the two di/dt signals at the input to the chosen amplifier are taken from the rates of change of current in phase windings sharing a common state within the inverter.

Irrespective of the method used to subtract the di/dt signals the result will be three new signals, where K is a constant containing all the multiplication factors in the signal chain.

$$\text{Signal } A = K\left(\frac{dIu}{dt} - \frac{dIv}{dt}\right).$$

$$\text{Signal } B = K\left(\frac{dIv}{dt} - \frac{dIw}{dt}\right).$$

$$\text{Signal } C = K\left(\frac{dIw}{dt} - \frac{dIu}{dt}\right).$$

Calculation of position from these signals now proceeds with vector mathematics to convert to two phase signals, Alpha and Beta $$\text{Alpha} = \text{Signal } A - \left(\frac{\text{Signal } B + \text{Signal } C}{2}\right)$$

$$\text{Beta} = \sqrt{3}\left(\frac{\text{Signal } B - \text{Signal } C}{2}\right)$$

The rotor angle is then calculated by the Arc Tangent of Beta/Alpha.

The rotor angle calculated in this way will be have two cycles per electrical cycle of the motor. A number of known methods can use this signal to create a single angle which has one angular rotation cycle for each whole electrical cycle of the motor.

In a synchronous reluctance motor with no magnets the two repeating cycles of inductance which make up each electrical cycle are identical and will produce the same torque independent of the direction of current. In a permanent magnet motor the two cycles are associated with the opposite magnetic polarity and must be distinguished to ensure the direction of the torque is correct.

When the motor is first excited known pulsing methods can be used to determine the polarity of the magnet and start the angle estimation with the correct initial half of the cycle.

In a three phase motor signals Signal A, Signal B and Signal C are also balanced three phase signals and two of them can be used to estimate the third. In such a case it is also possible to use the three Signals to cross-check each other. The coil used to create one of the di/dt measurements may have a higher current than the other two and the coil used to calculate that di/dt may itself become saturated and its signal may be lower than expected. In these conditions the three di/dt signals may no longer add up to zero and a correction algorithm can be implemented so that the robustness of the position estimation is not compromised.

As only two phase windings will share a common state in a given inverter state, the signals Signal A, Signal B and Signal C will be calculated at different times in the inverter switching sequence. However, it is always possible to configure the inverter to include the required common states within its normal operating sequence and to ensure that the signals Signal A, Signal B and Signal C do not occur too far apart in time so that they can be combined together in a single calculation of the angle of the rotor.

It will be understood that a combination of at least two of the three signals (which can be considered as first, second and third data related to position of the rotor) from three difference measurements can be used to derive a continuous estimate of the rotor position which can be used to synchronize the current in the motor phase windings to always produce maximum torque for a given current in a chosen direction even at very low speeds or zero speeds when EMF methods do not work.

Embodiments described herein, using the difference of rate of change of current (i.e. signals A, B and/or C), can have the significant advantage of being directly applicable to many different electrical motors, without requiring prior knowledge of those motors. Known methods, on the other hand, require various motor parameters as inputs in order to provide accurate position readings when operating at low speeds.

As a result of these improvements to rate of change of current measurements leading to more accurate inductive sensing methods for sensorless control of synchronous motors, the position of the rotor can be determined quite accurately and robustly. It is possible to run the motor accurately with inductive sensing methods and this can be used to make measurements and calculations of the flux linkage to current relationship of the motor phase windings at known rotor positions. Flux linkage is the product of flux and coil turns and is always equal to the integral of terminal voltage less any internal voltage drops due to resistance. In a linear inductance case it is the product of inductance and current but since inductance changes as the magnetic circuit becomes saturated it is more useful to use the concept of flux linkage as a function of current to represent the non-linearity of a magnetic circuit. Such data is required for sensorless control methods based on rotational emf and extended emf estimation. Prior art methods based on rotational emf estimation have had to rely on pre-calculated flux linkage to current relationships which contain inaccuracies or approximations or were often assumed to be linear with no change in inductance from low current to high current. With the improvements above, whilst the motor is rotating under the control of the inductive di/dt sensing methods, the current vector can be accurately positioned to a position of maximum torque and the position of the rotating reference frame will be locked to and will track the position of the extended emf (even if the motor may be rotating so slowly that the rotational emf could not otherwise be detected) such that Es_imag can be assumed to be zero. Under these conditions equation (5) simplifies to $$I_{s\_real}X_s = V_{s\_imag} - I_{s\_imag}R_s \qquad (9)$$

The left hand side of equation (9) is known to be non-linear and is the product of flux linkage and rotational velocity (rather than the product of current, inductance and velocity in the case of a constant inductance). The flux linkage as a function of current can therefore be calculated from measured values by dividing equation (9) by angular velocity and using equation (10)

$$\lambda(I_{s\_real}) = \frac{V_{s\_imag} - I_{s\_imag}R^s}{\omega}. \qquad (10)$$

Where Vs_imag and Is_imag are the components of the applied inverter voltage and the inverter current on the imaginary axis, orthogonal to the real axis, of the rotating reference frame, Rs is the resistance which may be taken from the stored data obtained in the initial step and ω is the angular velocity of the rotating reference frame at the time of the measurements.

Figure 12:
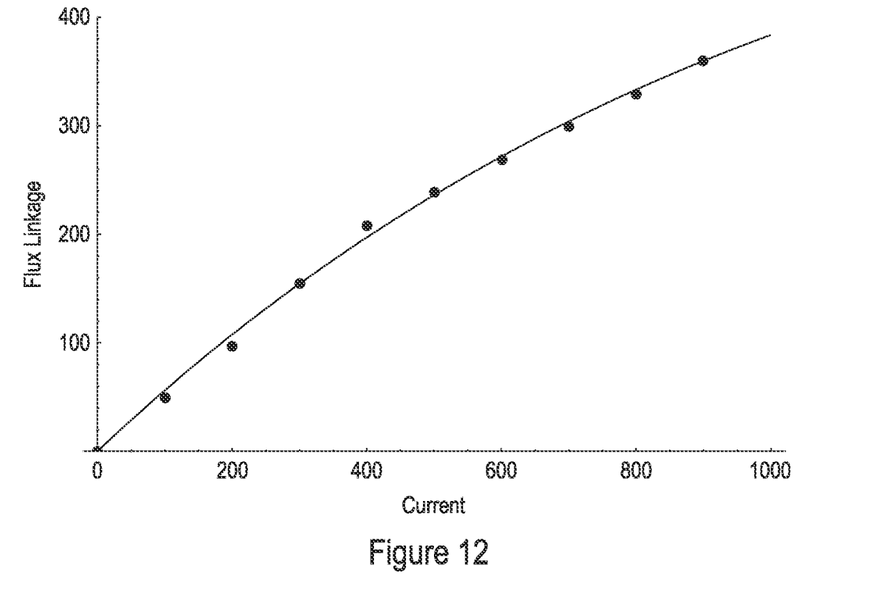
FIG. 12 shows a non-linear flux linkage to current characteristic calculated from data collected according to the invention.

Whilst the motor is running under the control of the di/dt signals, aligning the stator current vector to the rotor reference frame, the method performs repetitive calculations according to equation (10) at different currents and speeds building up the non-linear data set relating flux linkage to current with the rotor running at low speeds. Once a few data points have been collected, the controller can use the data directly with linear interpolation between points but the quality of the control is dramatically improved and extended by using the data set to fit a non-linear curve through the data points. Since the characteristics of a magnetic circuit are known to be that of a saturating function it is possible to fit the data to a non-linear saturating equation such as the Hill equation (https://en.wikipedia.org/wiki/Hill_equation_(biochemistry)) which is a non-linear saturating function used in medical applications. One useful form of the Hill equation is $$\lambda(I_{s\_real}) = \frac{a\,I_{s\_real}^n}{b + I_{s\_real}^n}, \qquad (11)$$

where a, b and n are constants to be determined to fit the calculated data from at least three measurement points. The constant n is usually between 0.5 and 1.5 and determines shape of the saturation curve. If n is greater than 1, the saturation follows a sigmoid shape where the gradient starts low at low current, then increases and then drops again at high current. When n<=1 the gradient starts steeply and reduces as the magnetic material starts to saturate. An example of a fitted Hill equation is shown in FIG. 12. Since the Hill equation naturally follows a saturating magnetic characteristic only a few data points are needed to create the whole characteristic. This effectively enables the motor to be calibrated for sensorless control using EMF estimation, by first running at low speeds under the synchronous and closed loop control of di/dt sensing methods while making measurements at a few current levels and fitting the flux linkage data points to a saturating non-linear function which provides data over the whole torque range of the motor, thus removing the need for complex calculations to determine the magnetic characteristic.

Once the non-linear magnetic characteristic of the motor has been identified the controller can proceed to use Equation (7) within the real time motor control. In each control loop execution the equation can be calculated on the estimated rotor reference frame to create a new value of $$E_{s_{imag}} = V_{s\_imag} - I_{s\_imag}R_s - \omega\lambda(I_{s\_real}). \qquad (12)$$

Any non-zero result of this calculation is an error in the estimated position of the rotor reference frame and of the rotor emf axis. If the error is positive the error is added to the estimated velocity through a suitable controller such as proportional and integral to create a new speed estimate and to predict the position of the rotor reference frame at the next time step. In this way the controller can track the position of the rotational emf axis by continuously ensuring that errors in the imaginary rotational emf are driven to zero.

The accuracy of the estimation using equation (12) is dramatically improved by the use of the non-linear flux linkage function determined within the inverter while the motor is rotating as this automatically includes all the scaling gains and measurement errors of a real system. As has been described the equation 12 works best at higher motor speeds where the rotational emf terms are larger. If the motor returns to low speed the controller can gradually return to closed loop synchronous control using instantaneous rate of change of current measurements. The transition between the two methods can be instantaneous or be gradual using a graduated weighting function which may be based on speed or based on speed and load.

Additionally when the motor returns to the instantaneous rate of change of current measurements at low speed the measurement of the flux linkage to current characteristics can be restarted if required, to add further detail to the non-linear function. In other words, re-calibration can take place every time the motor returns to low speeds (or once a week, once a month etc.) This approach can therefore be used on a continual basis or just used during commissioning.

An additional calculation can be performed in the real axis according to equation (13) since while under the control of the instantaneous rate of change of current methods the imaginary current is zero and equation (6) simplifies to (13)

$$E_{s_{real}} = V_{s\_real} - I_{s\_real}R_s. \qquad (13)$$

This equation (13) allows the value of the rotational emf to be calculated from the inverter measurements and after dividing by speed its value can also be stored as a function of current in the real axis. This is a record of the permanent magnet flux or torque producing flux in the real axis.

The data stored under these approaches can also be used as a condition monitoring feature in a motor control. Once stable imaginary axis flux linkage characteristic and/or real axis flux linkage characteristic have been stored, the motor can be monitored over its life for changes in those characteristics while the motor is running at low speeds when the calculation of the flux linkage characteristics are available. Any change in this characteristic could be a sign of deterioration in winding insulation or damage to one of the coils in the motor or demagnetisation of the permanent magnet. Such an approach allows early detection of demagnetisation of the magnets to be detected. The controller could be configured to limit the maximum current in the motor to avoid complete demagnetisation until the magnet condition is checked.

Figure 13:
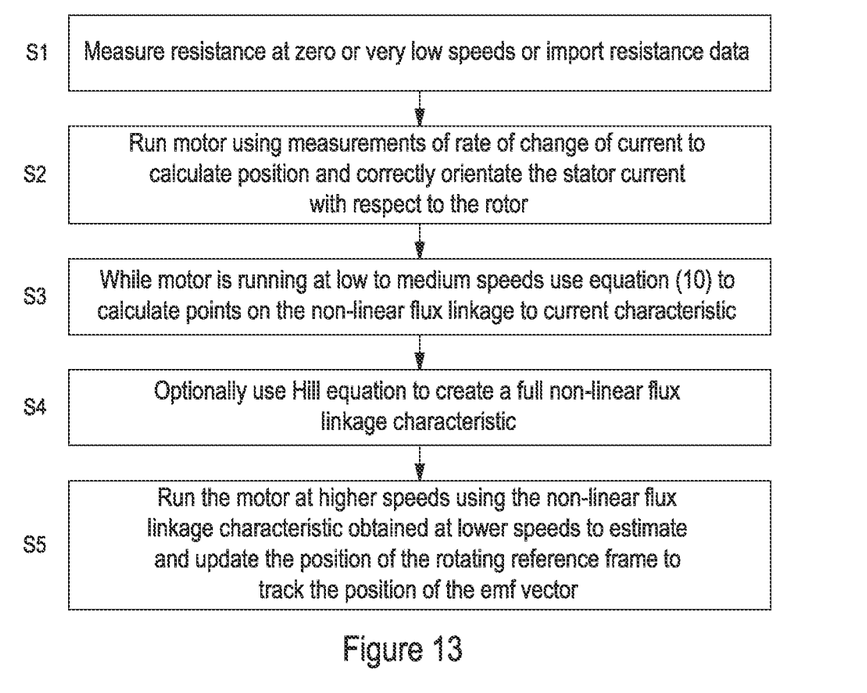
FIG. 13 shows a flow chart of a decision process occurring in an electronic control system according to the invention.

FIG. 13 shows a flow diagram illustrating the steps of a method performed by a control system according to an embodiment. The method comprises the following steps: Measure resistance at zero or very low speeds or import resistance data (S1). Run motor using measurements of rate of change of current to calculate position and correctly orientate the stator current with respect to the rotor (S2). While the motor is running with the correct orientation of stator current with respect to the rotor at low to medium speeds use equation 10 to calculate points on the non-linear flux linkage to current characteristic (S3), and optionally use a Hill equation to create a full non-linear flux linkage characteristic (S4). Run the motor at higher speeds using the non-linear flux linkage characteristic obtained at lower speeds to estimate and update the position of the rotating reference frame to track the position of the emf vector (S5).

Implementation of this invention has been described with reference to electric motors with rotors rotating relative to a stator. The invention can be applied directly to linear electric motors to control linear travel velocities under conditions of changing loads. Such motors still have electrical cycles which can be modelled as systems of rotating vectors.

The control schemes according to this invention can also be used to measure the non-linear magnetic characteristics of a generator and then control the generator using the extended emf method with much greater accuracy that would be possible with off-line calculations of the magnetic characteristics.

The Figures have illustrated electric motors with the phase windings connected in star configuration. All the described approaches will work in an identical manner if the motor is connected in delta.

In any of the techniques described relying on the measurement of rate of change of current, the techniques can be implemented using any method of creating a rate of change of current. Examples could include the analogue differentiation of a measurement of the current; the measurement of two instantaneous current readings a short time apart and then numerically calculating the rate of change of current.

FIG. 11 shows how three Rogowkski coils can be connected to three operational amplifiers to calculate the difference and amplify the result to create Signal A, Signal B and Signal C. As Signal A, Signal B and Signal C can be measured in specific inverter states, a multiplexer can be used to select the inputs to one or more amplifiers to perform the required subtraction and amplification at each known inverter state. In this way the number of operational amplifiers and number of analog to digital converters can be reduced. This also allows the new difference calculations to be supplemented with measurements of di/dt in a single phase winding.

In safety critical applications it is often highly desirable to have redundancy of rotor position detection. The methods described can be used to supplement a rotor position sensor such that a low cost sensor can be enhanced to give high resolution and robustness. That is, the motor control system described herein may comprise one or more sensors to provide additional rotor position readings.

What is claimed is:

1. A control system for an electrical motor comprising a rotor, a stator having a plurality of phase windings, and an inverter for applying voltage to the plurality of phase windings by connecting individual phase windings to a first or second voltage level, the control system configured:
   a) to measure a first rate of change of current in a first phase winding, of said plurality of phase windings, connected to the first voltage level;
   b) to measure a second rate of change of current in a second, different phase winding connected to the first voltage level;
   c) to calculate a difference between the first and second rate of change of current to obtain a first signal, A;
   d) to repeat steps a) to c) for one of (i) the first and a third phase windings or (ii) the second and third phase windings when both phase windings are connected to the same first or second voltage level to obtain a second signal, B;
   e) to use the first, second and third signals, A and B, to obtain data related to a position of the rotor and to use the data related to the position of the rotor to determine the position of the rotor relative to the stator;
   f) to operate the motor in a low speed regime; and
   g) while operating in the low speed regime, to measure a stator current in the phase windings of the stator arising from an application of a stator voltage, and to calculate a motor characteristic of the electrical motor from positions of the rotor, the stator voltage, the stator current, and a resistance of the phase windings.

2. The control system of claim 1, wherein the system is further configured to use the determined position of the rotor relative to the stator to control operation of the electrical motor.

3. The control system of claim 1, wherein the system is configured to measure the first and second rates of change of current substantially simultaneously.

4. The control system of claim 1, further comprising at least one sensor coil located in proximity to said first and second phase windings, wherein the system is configured to measure a voltage in the at least one sensor coil to determine the first and second rates of change of current.

5. The control system of claim 4, wherein the at least one sensor coil is a Rogowski coil arranged such that a current in said first phase winding passes through the Rogowski coil in a first direction and a current in said second phase winding passes through the Rogowski coil in a second direction opposite to the first direction to calculate the difference between the first and second rate of change of current.

6. The control system of claim 1, comprising:
   a first Rogowski coil arranged such that the current in the first phase winding passes through the first Rogowski coil;
   a second Rogowski coil arranged such that the current in the second phase winding passes through the second Rogowski coil; and
   a first differential amplifier connected to the first and second Rogowski coils to calculate the difference between the first and second rate of change of current.

7. The control system of claim 6, further comprising:
   a third Rogowski coil arranged such that the current in the third phase winding, passes through the third Rogowski coil to measure a third rate of change of current; and
   a second differential amplifier connected to the first and third Rogowski coils to calculate the difference between the first and third rate of change of current.

8. The control system of claim 7, wherein the system is configured to measure the third rate of change of current when the third phase winding is connected to the first voltage level.

9. The control system of claim 7, comprising a third differential amplifier connected to the second and third Rogowski coils to calculate the difference between the second and third rate of change of current.

10. The control system of claim 9, wherein each differential amplifier is an operational amplifier.

11. The control system of claim 2, wherein the control system is further configured to control the electrical motor by synchronising currents in the plurality of phase windings based on the determined position of the rotor relative to the stator.

12. A control system for an electrical motor comprising a rotor, a stator having a plurality of phase windings, and an inverter for applying voltage to the plurality of phase windings by connecting individual phase windings to a first or second voltage level, the control system configured:
- to measure a first rate of change of current in a first phase winding, of said plurality of phase windings, connected to the first voltage level;
- to measure a second rate of change of current in a second, different phase winding connected to the second voltage level;
- to measure a third rate of change of current in a third, different phase winding connected to the second voltage level;
- to calculate a difference between the first rate of change of current and a sum of the second and third rates of change of current to obtain an improved measurement of the first rate of change of current;
- to use the improved measurement to obtain data related to a position of the rotor and to use the data related to the position of the rotor to determine the position of the rotor relative to the stator;
- to operate the motor in a low speed regime; and
- while operating in the low speed regime, to measure a stator current in the phase windings of the stator arising from an application of a stator voltage, and to calculate a motor characteristic of the electrical motor from positions of the rotor, the stator voltage, the stator current, and a resistance of the phase windings.

13. An electrical motor comprising the control system of claim 1.

14. The control system according to claim 1, wherein the control system is further configured to repeat steps a) to c) for the other one of (i) the first and the third phase windings or (ii) the second and the third phase windings when both phase windings are connected to the same first or second voltage level to obtain a third signal, C, and to use the third signal, C, together with the first and second signals A and B to obtain the data related to the position of the rotor.

15. The control system according to claim 14, wherein the data related to the position of the rotor comprises a first phase signal (Alpha) and a second phase signal (Beta), wherein $$\text{Alpha} = \text{Signal } A - \left(\frac{\text{Signal } B + \text{Signal } C}{2}\right)$$

$$\text{Beta} = \sqrt{3}\left(\frac{\text{Signal } B - \text{Signal } C}{2}\right).$$

16. The control system according to claim 15, wherein the position of the rotor relative to the stator comprises a rotor angle, and wherein the rotor angle is calculated by the Arc Tangent of Beta/Alpha.

* * * * *